United States Patent
Zambon et al.

(10) Patent No.: US 6,392,743 B1
(45) Date of Patent: May 21, 2002

(54) CONTROL TECHNIQUE FOR MICROLITHOGRAPHY LASERS

(75) Inventors: Paolo Zambon; Gamaralalage G. Padmabandu, both of San Diego; Tom A. Watson, Carlsbad; Palash P. Das, Vista, all of CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/515,974

(22) Filed: Feb. 29, 2000

(51) Int. Cl.[7] .................. G03B 27/72; G03B 27/54; G03B 27/32; H01S 3/22
(52) U.S. Cl. ............... 355/69; 355/67; 355/77; 372/57
(58) Field of Search ............... 355/69, 67, 77; 372/60, 57, 25

(56) References Cited

U.S. PATENT DOCUMENTS

| | | | |
|---|---|---|---|
| 5,991,324 A | 11/1999 | Knowles et al. | 372/57 |
| 6,005,879 A | 12/1999 | Sandstrom et al. | 372/25 |
| 6,018,537 A | 1/2000 | Hofmann et al. | 372/25 |
| 6,128,323 A | 10/2000 | Myers et al. | 372/38 |
| 6,188,710 B1 * | 2/2001 | Besaucele et al. | 372/60 |

\* cited by examiner

*Primary Examiner*—Russell Adams
*Assistant Examiner*—Peter B. Kim
(74) *Attorney, Agent, or Firm*—John R. Ross, Esq.

(57) ABSTRACT

A lithograph quality optimization process for controlling laser beam parameters when changing operating modes. The laser is programmed to automatically conduct an optimization procedure preferably in less than one minute to adjust laser operating parameters such as blower speed, total gas pressure and F2 partial pressure in order to optimize beam quality parameters.

7 Claims, 5 Drawing Sheets

CONTROL TECHNIQUE FOR MICROLITHOGRAPHY LASERS

This invention relates to laser control techniques as especially to control techniques for microlithography lasers.

BACKGROUND OF THE INVENTION

Lithography Lasers

Integrated circuits are typically printed on silicon wafers using microlithography machines. There are two types of these machines: stepper machines and scanner machines. The light source for most of these machines currently being sold are gas discharge lasers. Currently the most used gas discharge lasers are the krypton-fluorine (KrF) excimer lasers which are pulse lasers operable at repetition rates up to about 1000 Hz or up to about 2000 Hz. The typical pulse energy is in the range of about 5 mJ to about 12 mJ. Most of these lasers now operating are the 1000 Hz models although the 2000 Hz models have now been available for about 18 months. Many of the details of a 1000 Hz KrF laser are described in U.S. Pat. No. 5,991,324. A 2000 Hz $F_2$ laser is described in U.S. Pat. No. 6,018,537; and a 2000 Hz KrF laser is described in U.S. patent application Ser. No. 09/157,067. A technique for pulse energy control of these lasers is described in U.S. Pat. No. 6,005,879. These patents and this patent application are incorporated herein by reference. As more completely described in the above referenced documents, lasing occurs in a resonance cavity typically created between a line narrowing module and an output coupler which is typically a partially reflecting mirror. The line narrowing module typically comprises a prism beam expander and a grating for narrowing the bandwidth of the beam. In most lithography lasers, a tuning mirror is used to select the center wavelength retro reflected from the grating which is done by the angle at which the laser beam illuminates the grating. The gain medium is an electric discharge region between two elongated electrodes. Laser gas for the KrF laser is a mixture of about 0.1% fluorine, 1% krypton and the rest a buffer gas neon.

Control Mechanisms

The energy of each pulse is typically controlled in an automatic feedback arrangement by adjusting the charging voltage of a pulse power system which provides a pulse discharge approximately proportional to the charging voltage. Between each discharge, the laser gas in the discharge region must be replaced. This is accomplished with a tangential blower which at 3500 rpm creates a steady gas flow between the electrodes of about 20 to 30 meters per second for 2000 Hz operation. This means that the laser gas flows about 1.25 cm between discharge at a pulse repetition rate of 2000 Hz. Since the discharge region is only about 0.5 cm wide, the products of one discharge are sufficiently moved out of the region before the subsequent discharge.

Burst Mode Operation

The temperature of the laser gas is controlled by a water cooled, finned heat exchanger to temperatures in the range of about 30° C. to 60° C. At continuous operation, for example at 1000 Hz, the temperature can be controlled without much variation, with time, although there is a temperature drop across the heat exchanger of a few degrees centigrade and a corresponding average temperature increase across the electrodes. Each pulse heats the discharge region, and this hot spot spreads out as the gas circulates around the chamber. At a blower speed of 3500 rpm, it takes about 10 to 15 milliseconds for the heated gas from a given discharge to return to the discharge region. When the laser is operating in a continuous mode, equilibrium conditions are quickly developed in the flow region around the laser chamber; however, continuous mode operation is not normal for lithography lasers. Lithography lasers are normally operated in a so-called "burst" mode. A typical burst mode would be "on" for 0.15 seconds at a repetition rate of 2000 Hz (for 300 pulses), then "off" for 0.3 seconds while the lithography machine moves to a new die region of the wafer, then "on" for another 0.15 second, and "off" again for 0.3 seconds. This operation continues until all of the die regions of the wafer (for example 120) are treated. Then the wafer is replaced with another wafer which may take a few seconds such a six seconds. Thus, one wafer per minute would be treated at this rate. This burst mode operation results in significant temperature swings in the laser gas which can directly and indirectly affect the quality of the laser beam.

Beam quality is extremely important for the lithography machines which are currently printing circuits with line widths in the range 0.25 micron. (A human hair is about 50 microns thick.) Therefore, lithography lasers are typically equipped with metrology equipment which measures for each laser pulse:

centerline wavelength bandwidth pulse energy

The laser also uses these values to report quality variation. Typical beam quality parameters are:

(1) Energy sigma ($\sigma_E$) defined as:

$$\sigma_E = \sqrt{\frac{\sum_{i=m}^{m+k}(E_i - E_T)^2}{k}} \bigg/ E_T$$

where m is the first pulse of a k pulse rolling window (k being the number of pulses in the window) and $E_T$ is a target pulse energy such as 10 mJ.

(2) Energy Variation from Target ($E_V$) also called "energy stability" defined as: $E_V$=maximum value of $E_i - E_T$ in a k-pulse window.

(3) Dose Variation ($D_V$) (also called "dose stability") defined as:

$$D_V = \left(\frac{\sum_{i=m}^{m+k} E_i}{k} - D_T\right) \bigg/ D_T$$

where $D_T$ is a target dose for a k size window.

(4) Wavelength Sigma ($\sigma_\lambda$) defined as:

$$\sigma_\lambda = \sqrt{\frac{\sum_{i=m}^{m+k}(\lambda_i - \lambda_T)^2}{k}}$$

(5) Wavelength Variation ($\lambda_V$) also called "wavelength stability" defined as:

$$\lambda_V = \frac{\sum_{i=m}^{m+k} \lambda_i - \lambda_T}{k}$$

(6) Bandwidth (Δλ) defined as pulse spectral width at one half maximum intensity (FWHM).

By tradition, the units of $\sigma_E$ and $D_V$ are expressed in percent. $E_V$ units are millijoules, mJ. The units of $\sigma_\lambda$, $\Delta_\lambda$ and $\lambda_V$ are picometers, pm.

These values are stored temporarily in a memory buffer of the laser controller and can be read out to an external information processor or storage device or can be read by the stepper/scanner as desired.

Typical specifications for a KrF excimer laser might be:

| | | |
|---|---|---|
| Wavelength stability (40 pulse window) | = | ±0.07 pm |
| Wavelength sigma | = | ±0.06 pm |
| Bandwidth | = | 0.6 pm |
| Dose stability (40 pulse window) | = | 0.4 percent |
| Energy Sigma (40 pulse window) | = | 12 percent |
| Energy stability (40 pulse window) | = | 7.5 percent |

These specifications are examples of the type of quality standards which are applied to determine if a laser's performance passes an acceptance test prior to shipment from the laser fabrication plant. These values are sometimes reported as maximum values during a specified period of time. The sigma values are typically reported as "3 sigma" values.

SUMMARY OF THE INVENTION

The present invention provides a lithograph quality optimization process for controlling laser beam parameters when changing operating modes. The laser is programmed to automatically conduct an optimization procedure preferably in less than one minute to adjust laser operating parameters such as blower speed, total gas pressure and F2 partial pressure in order to optimize beam quality parameters.

DETAILED DESCRIPTION OF PREFERRED EMBODIMENTS

Control of Beam Parameters

Figure 1:
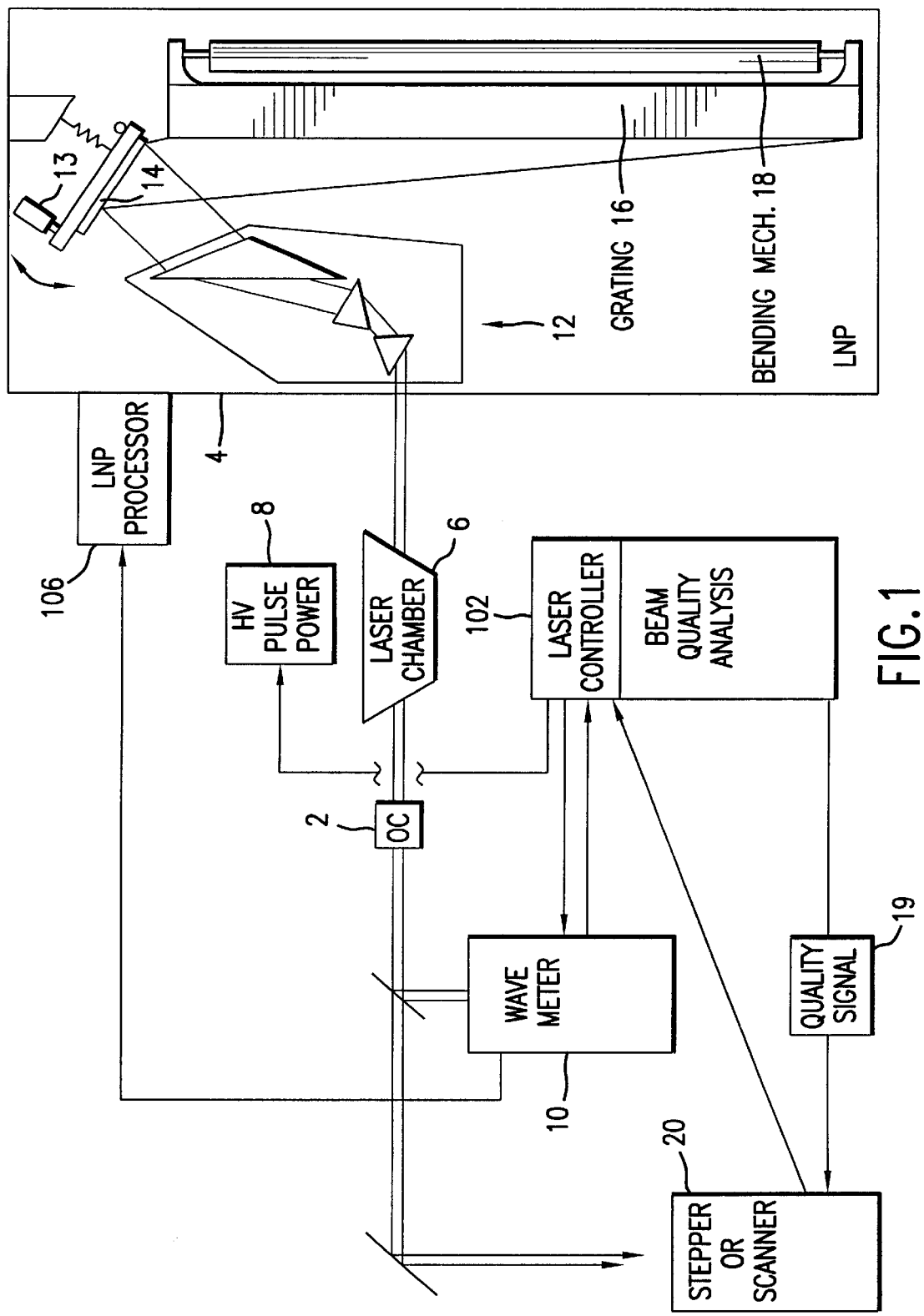
FIG. 1 shows features of a lithography laser and a lithography machine.

FIG. 1 is a block diagram showing the principal equipment utilized to practice the present invention. Beam parameters (centerline wavelength, bandwidth and pulse energy) of the laser beam from laser chamber 6 are measured by wavemeter 10. Laser controller 102 uses this information in feedback techniques to control pulse energy by regulating the charging voltage in high voltage pulse power system 8 and to control the wavelength by controlling through stepper motor 13 the pivot position of tuning mirror 14 which in turn controls the angle at which the beam expanded by a three-prism beam expander 12 illuminates grating 16. The bandwidth in this system can be adjusted to some extent by bending of the grating with bending mechanism 18. Laser controller 102 also does beam quality analysis and reports beam quality information 19 to stepper or scanner 20 which also gives direction to laser controller 102.

Cause of Beam Quality Variations

As indicated in the Background section, continuous operation of the laser can result in very stable conditions and very stable beam quality parameters. Also stable operation permits adjustments of laser parameters such as fluorine concentration, charging voltage total gas pressure, blower speed, tuning mirror position and grating curvature to optimize beam quality parameters. Burst mode operation, even when the periodic bursts repeat continuously over long periods, cause substantial temperature fluctuations in the discharge region and other effects which tend to affect beam quality. Laser controller 102 is programmed with algorithm which automatically adjusts the charging voltage to control pulse energy and integrated dose to desired levels and to control the position of tuning mirror 14 to provide control of wavelength. Automatic adjustment of cooling water flow maintains average gas temperature within a desired range. In addition, for operation in a continuous burst mode, the fluorine concentration, the total pressure and the blower speed should be adjusted to provide optimized performance for that particular mode.

In accordance with the present invention, as the stepper or scanner illumination requirements change necessitating a change in the laser mode of operation, the laser is notified of the change and the laser is preprogrammed to automatically optimize itself for the new mode of operation with the objective of optimizing integrated circuit quality and minimizing total cost of operation for the lithography system.

Need to Optimize for Quality and Cost

Figure 2:
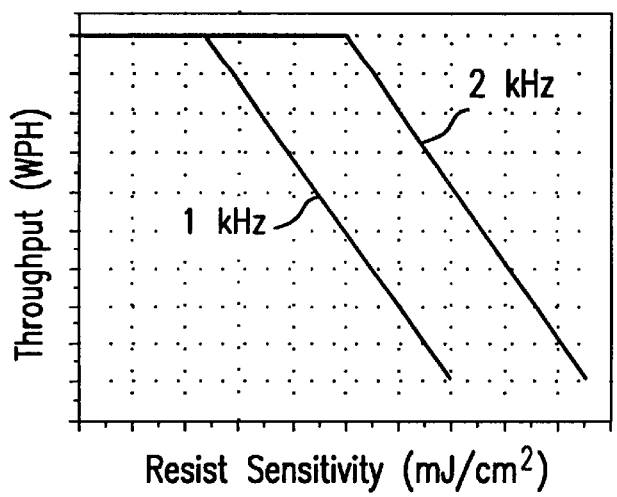
FIG. 2 shows wafer throughout with 1 and 2 KHz lasers.

State of the art lithography lasers currently being sold for use on stepper and scanner machines are designed for operation at about 2000 Hz with pulse energies in the range of about 10 mJ. Many resists used by the integrated circuit fabricators can fully utilize all of the light energy produced by these lasers so that throughput (in terms of wafers per hour) can be substantially increased with the 2000 Hz laser as compared with 1000 Hz lasers This means greater throughput. The general relationship between resist sensitivity and throughput for 1 KHz and 2 KHz lasers is shown in FIG. 2. However, some resists have sensitivity values so low that integrated circuit quality would be compromised if laser energy were used at design values. In these situations, the laser can be operated at pulse energies below the design value; at repetition rate below design rate; the output beam could be attenuated or any combination of these techniques could be used.

Resists Variations

In many actual fabrication situations, due to use of different resists, needed beam energies can vary substantially over a production day. However, resists typically changes occur between wafer batches so that illumination requirements do not change more often than many minutes or several hours.

Laser Optmization

There are several ways to reduce illumination rates. For example, if because of a change in resist, illumination requirements are reduced by half, it would be a simple matter to reduce the pulse energy by one-half or the pulse rate by one-half or both could be reduced by one-fourth. In the past, the choices have been made without much thought given to the consequences. Applicants, however, have developed techniques to permit proper choices to be made to optimize integrated circuit quality and cost of operation.

Dose Stability Effects

Figure 3:
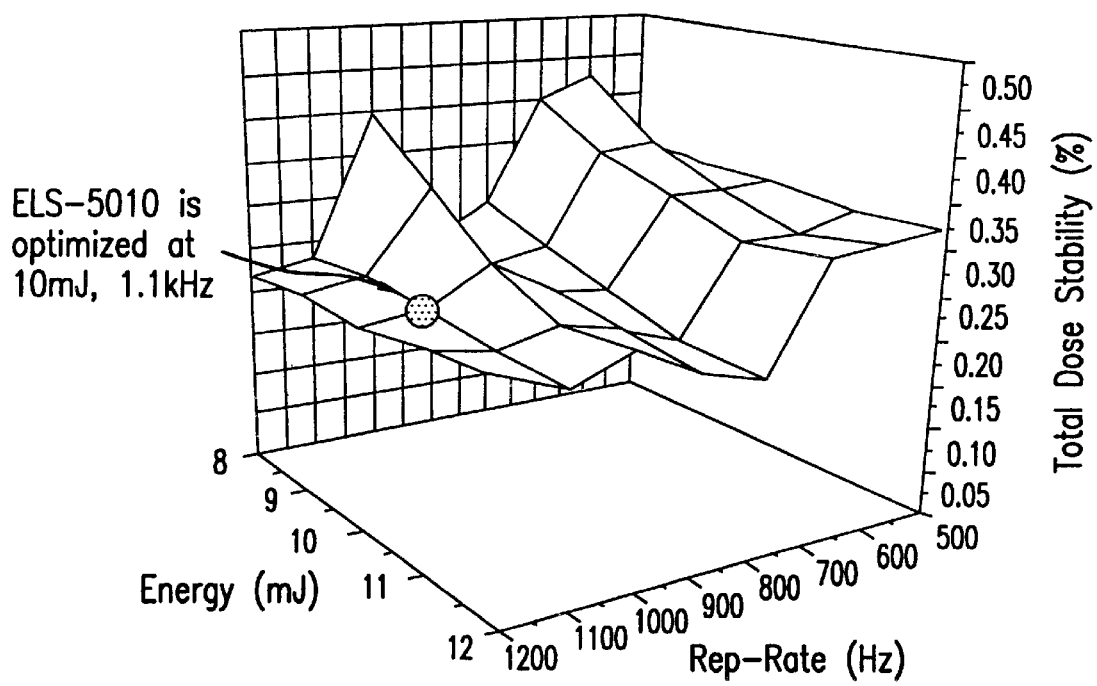
FIG. 3 is a 3D graph showing variation of dose stability with energy and repetition rate.

An extremely important beam quality parameter is dose variation, also called dose stability. This parameter is defined above. It tells the operator how laser energy applied to the resist on a die area of a wafer differs from a target dose. As stated above, a typical specification would be 0.4 percent maximum variation over a test period. Applicants have performed experiments to determine the effect on dose variation of changing pulse energy and/or repetition rate of a laser optimized for operation at certain pulse energies and repetition rates. For example, FIG. 3 is a 3-D graph showing these effects for a laser optimized to operate at an average power of 1.1 Watt at 10mJ and 1.1 KHz. Dose stability at these operating conditions is about 0.3%. However, reducing the power to 0.8 watts by lowering the pulse rate to 1000 Hz and the pulse energy to 0.8J would increase the dose variation to more than 0.4% (an increase of more than 30%!).

Preferred Optimization Process

Applicants have determined that very substantial improvements in beam quality can be obtained by utilizing a relatively simple optimization process when changing beam illumination requirements. A preferred process is as follows:

(1) Prior to exposing a lot, scanner informs the laser about the laser's required repetition rate and energy (determined by the process engineer). Applicants refer to this as a "LOT CHANGE" signal.

(2) The laser controller is programmed with a control program which uses the lot change signal to optimize its conditions. In this preferred embodiment, the parameter used for laser's internal optimization are the following:
Total gas pressure
$F_2$ partial pressure
Speed of the laser's blower (lower repetition rate requires lower blower speed)
Adjustment of laser's energy control algorithm.

(3) The laser then checks itself for optimum parameters by initiating test pulses and for a few seconds then informs the scanner when it is ready for exposure.

Tests show that this process takes less than 1 minute, which is usually less than the time taken to change the lot.

The reader should note that variable repetition rate and variable energy operation are achieved without any change to laser modules. The optimization process described here is completely automated and does not require user intervention.

Total Gas Pressure and $F_2$ Pressure

Figure 5:
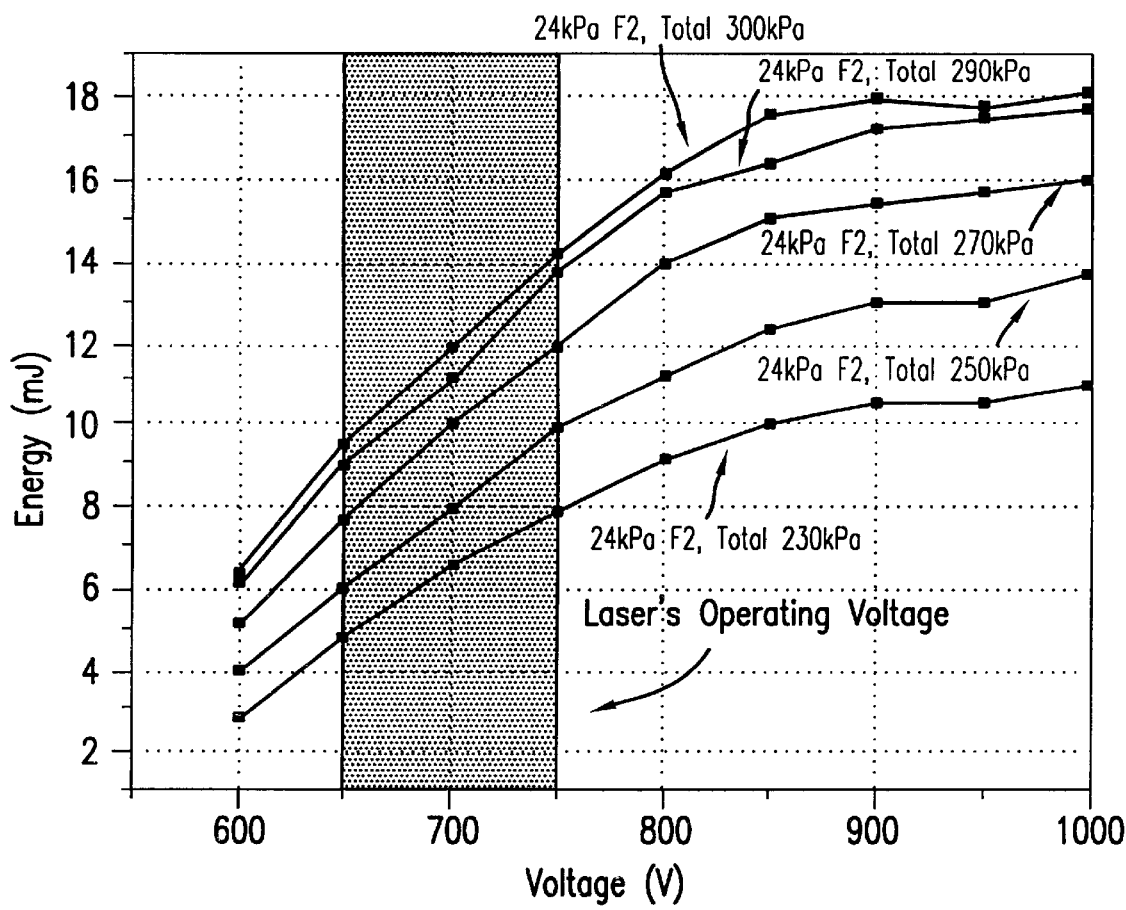
FIG. 5 shows relationship of pulse energy voltage, $F_2$ partial pressure and total pressure.

For a given $F_2$ pressure, the laser's output energy depends on the total gas pressure. Thus, the laser's output energy may be changed by adjusting the total pressure of the laser. For a particular laser tested by Applicants, the relationship between total gas pressure, charging voltage and pulse energy is shown in FIG. 5. The laser computer is programmed with this information and uses it to determine a total gas pressure to achieve a desired pulse energy. This takes less than 30 seconds. Also, the linewidth shows a slight dependence on energy, but this appears to be small.

The reader should note that the desired pulse energy could also be achieved by changing the charging voltage and leaving the total pressure and $F_2$ concentration unchanged. Alternatively, $F_2$ concentration could be changed while keeping charging voltage and total pressure unchanged. However, several laser parameters can be adversely affected by changes in $F_2$ concentration or the charging voltage. The presumption is prior to the called-for change, the laser was operating at optimum $F_2$ and charging voltage conditions. Changing the total gas pressure changes pulse energy substantially but has minimal effect on beam quality.

Total gas pressure is increased by injecting a mixture of 99 percent Ne and 1.0 percent Kr with no $F_2$. Total gas pressure is decreased by releasing gas from the chamber. When this happens, some of the $F_2$ will be released which will cause the efficiency of the laser to decrease. The controller is programmed therefore to inject (coincident or approximately coincident with the release) an amount of fluorine equal to the amount lost. This whole process takes less than 30 seconds. The principal advantage of this technique is that the $F_2$ concentration is not changed; therefore, there is no adverse affect on beam quality due to non-optimum $F_2$ concentrations.

Blower Speed

As indicated in the Background section, the gas flow between the electrodes must be great enough to remove from the discharge region the products (including heat) of a discharge prior to the next discharge. This requires a gas velocity of about 1.25 cm/0.5 ms at a pulse repetition rate of 2000 pulses per second. Thus if each pulse deposits about 2T of heat energy in the gas in the 0.5 cm wide discharge region that amount of heat energy is carried away by a "slug" of gas 1.25 cm long. For example, a laser may be operating at a pulse rate of 2000 Hz with the blower rotating at 3500 rpm to produce the needed 1.25 cm/0.5 ms flow rate. To reduce the illumination rate by 50% the mode of operation could be changed so that the repetition rate is reduced to 1000 Hz with all other conditions remaining the same.

In this new mode the 2T of heat energy is deposited in a slug of gas about 2.5 cm long.

Applicants have discovered that substantial reductions in pulse reductions in pulse repetition rates will adversely affect beam quality unless the blower speed is also reduced. As a rule of thumb, the preferred reduction in blower speed is proportional to the reduction in repetition rate. This discovery was surprising, since the prior belief was that it did matter how fast or for the products of a discharge were removed, so long as they were removed from the discharge region prior to the next pulse. However, Applicants have discovered that very minor temperature gradients from one side of the discharge region to the other can affect the wavelength of the laser beams due to the change of the index of refraction of the laser gas with temperature. A constant small gradient is no problem since it can be easily and automatically cancelled out by a very small automatic change in the pivot position of tuning mirror 14. However, if the gradient is changing and changing rapidly especially in an unknown or random fashion, the laser controls will be less effective and beam quality will suffer.

Energy Algorithm

In this preferred embodiment laser controller 102 is equipped with a control algorithm such as that described in U.S. Pat. No. 6,005,879. This algorithm learns from previous bursts, what charging voltages are needed to produce the target energy in future bursts. The algorithm also keeps track of total energy in a burst so that the total dose energy is controlled at or close to a target dose. That patent has been incorporated herein by reference. This algorithm operates by calculating (based on the earlier data) and storing correction parameters in "bins" of a computer memory bank for each of the first "W" pulses (such as 40) of a burst. The bins are continuously updated. Therefore, with a change in mode these bins will be automatically corrected to provide optimized pulse and dose energy correction.

Applicants' Optimization Experiments

Figure 4:
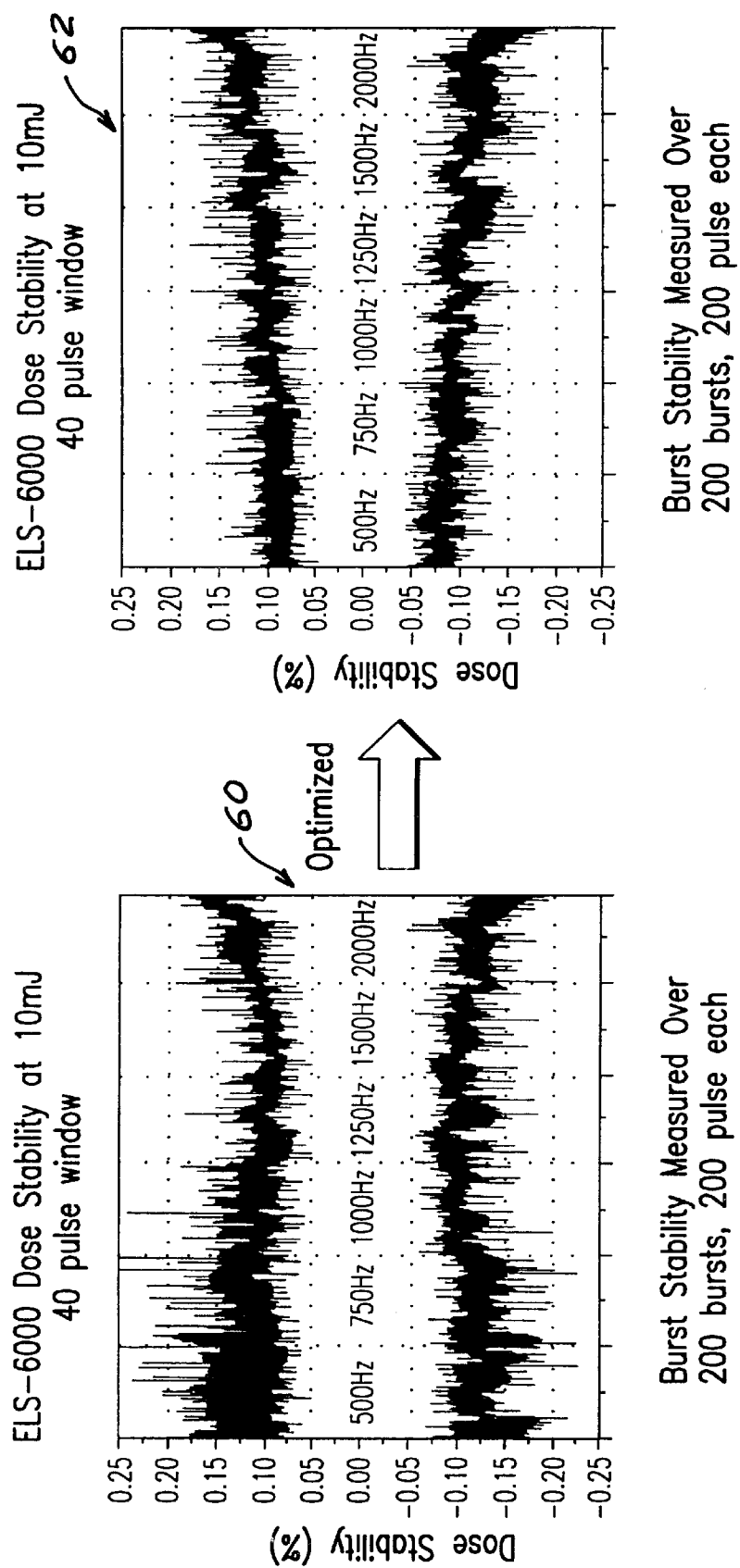
FIG. 4 shows advantages of optimization.
Figure 6:
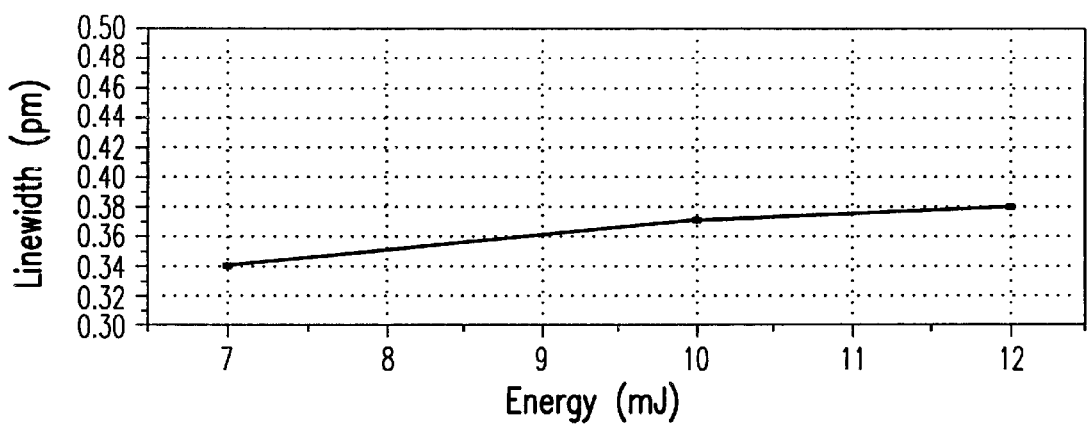
FIG. 6 shows line width as a function of pulse energy.
Figure 7:
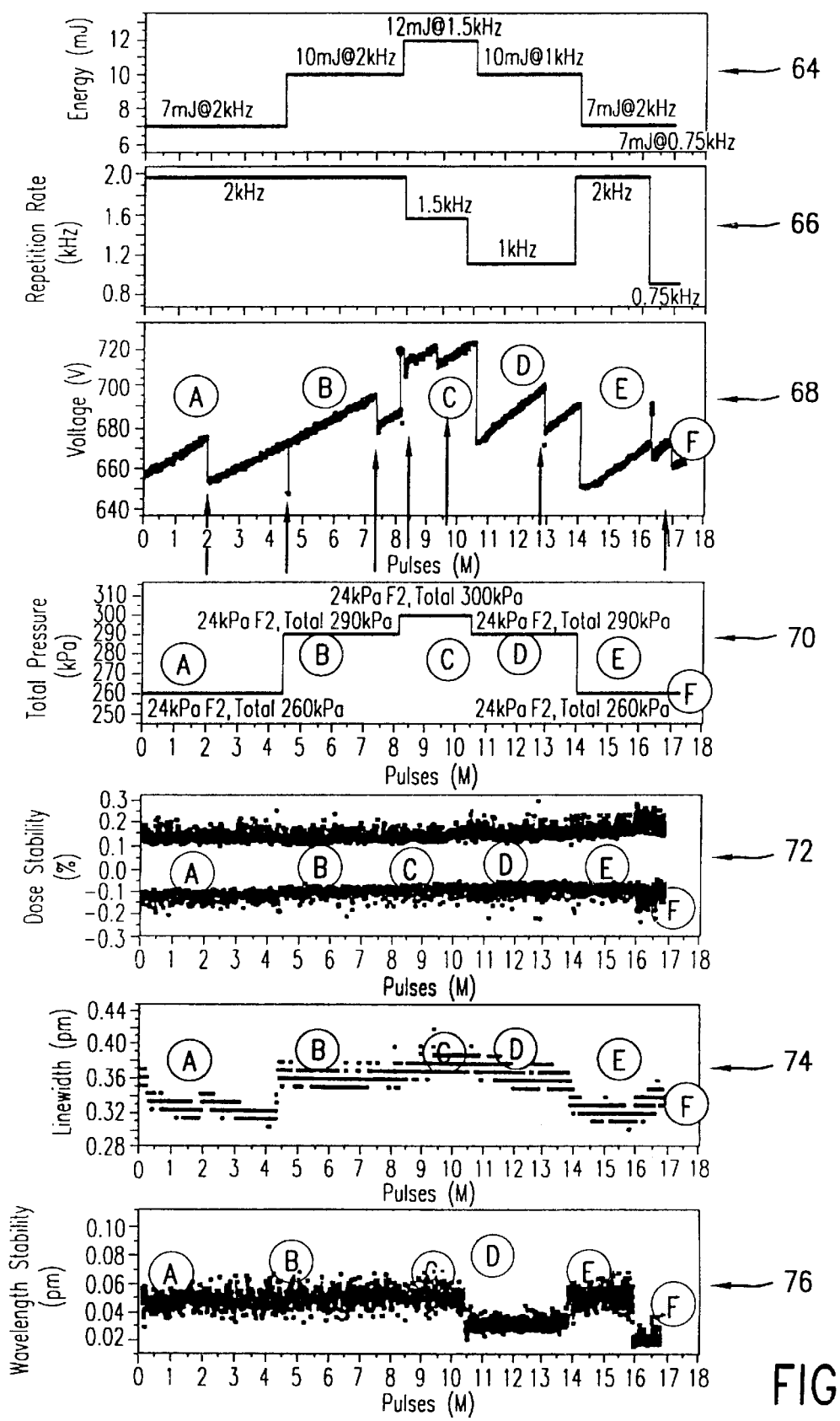
FIG. 7 shows results of an optimization according to the present invention.

FIG. 4 shows the result of an experiments performed by Applicants to prove the advantages of the present invention. A KrF, 2000 Hz lithography laser was optimized using techniques discussed above for best performance at 2000 Hz. Then the repetition rate was reduced in the increments indicated in the chart at 60 in FIG. 4 and dose stability values were plotted. As shown in the 60 chart, performance was very poor at repetition rates at 1000 Hz and lower. Then the same experiment was repeated by the laser was optimized at each increment by reducing the blower speed in proportion to the pulse repetition rate. The results are shown at 62 in FIG. 4. The results are very impressive. Dose stability is almost constant. Line width was well within specifications without such variation and wavelength stability was also well within specification throughout the range. There is as indicated a slight general increase in line width with pulse energy as shown in FIG. 7 and as shown in FIG. 6.

Chart 64 shows a plot of pulse energy plotted as a function of millions of pulses for a series of tests. Chart 66 shows repetition rates for the tests. Chart 69 shows the charging voltage for the tests. Chart 70 shows total chamber pressure and F2 partial pressure during the tests. Chart 72 shows measured dose stability and chart 74 and 76 respectively show line width and wavelength stability.

While the invention has been described above with specificity in terms of preferred embodiments, the reader should understand and recognize that many changes and alterations could be made without deviating from the spirit of the invention. Therefore, the scope of the invention should be determined by the appended claims and their legal equivalents.

We claim:

1. A lithography quality optimization process for controlling laser beam parameters of a pulse laser providing light for a lithography machine, said process comprising the steps of:

A) optimizing said laser for operation in a desired mode corresponding to an operating mode of said lithography machine, B) programming said lithography machine to inform said laser machine prior to a change in the lithography operating mode necessitating a change in the laser operating rode, including pulse energy and repetition rate, defining a new laser operating mode, C) programming said laser to automatically conduct an optimization procedure to determine new laser operating parameters needed to produce optimum laser beam quality at the new laser operating mode and to automatically make changes to convert operation of the laser to the new laser operating parameters.

2. A process as in claim 1 wherein said optimization procedure is performed in less than one minute.

3. A process as in claim 1 wherein said laser operating parameters comprise blower speed.

4. A process as in claim 1 wherein said laser beam operating parameters comprise blower speed and total gas pressure.

5. A process as in claim 1 wherein said laser beam operating parameters comprise blower speed, total gas pressure, and $F_2$ partial pressure.

6. A process as in claim 5 wherein said parameters also comprise energy control algorithm bin parameters.

7. A process as in claim 1 wherein step B takes place at the time of a lot change.

* * * * *